United States Patent [19]

Tomikawa et al.

[11] Patent Number: 5,604,440
[45] Date of Patent: Feb. 18, 1997

[54] METHOD OF TESTING A WIRE HARNESS USING A MULTICONTACT CONNECTOR

[75] Inventors: Kazuyoshi Tomikawa; Toshinori Igura; Takayuki Tsuchiya, all of Shizuoka, Japan

[73] Assignee: Yazaki Corporation, Tokyo, Japan

[21] Appl. No.: 504,790

[22] Filed: Jul. 20, 1995

[30] Foreign Application Priority Data

Jul. 22, 1994 [JP] Japan .................................. 6-170789

[51] Int. Cl.$^6$ .................................................. G01R 27/76
[52] U.S. Cl. ........................... 324/539; 439/310; 324/538; 324/761
[58] Field of Search .................................. 324/537, 754, 324/530, 758, 761; 439/488, 310

[56] References Cited

U.S. PATENT DOCUMENTS

| | | | |
|---|---|---|---|
| 4,744,770 | 5/1988 | Drogo | 434/310 |
| 4,949,035 | 8/1990 | Palmer | 324/758 |
| 5,097,213 | 3/1992 | Huntig | 324/538 |
| 5,335,413 | 8/1994 | Yamamoto | 324/761 |
| 5,455,515 | 10/1995 | Saijo et al. | 324/761 |
| 5,500,606 | 3/1996 | Holmes | 324/758 |

FOREIGN PATENT DOCUMENTS

0387732  9/1990  European Pat. Off. ............... 324/538

*Primary Examiner*—Maura K. Regan
*Attorney, Agent, or Firm*—Armstrong, Westerman, Hattori, McLeland & Naughton

[57] ABSTRACT

A connector formed with a first portion on the connector positioned differently according to a kind of the connector. The first portion is, for example, the forward end of a terminal or a cutout formed on the housing of the connector. At least one multicontact switch pin is fixedly arranged on a carriage base in a direction such that the probe pin of the multicontact pin extends towards the first portion. The switch pin has at least two contacts and a probe pin projecting outwardly of the multicontact switch pin. Each of the contacts is connected to a corresponding test circuit. The probe pin is adapted to move into and/or out of contact with the contacts when the probe pin is pushed inwardly into the multicontact switch pin. The carriage base is moved by a predetermined distance towards the connector to allow the probe pin to engage the first portion so that the probe pin moves into and/or out of contact with said contacts. Continuity in the test circuits is checked to determine the position of the first portion in a direction in which the probe pin moves towards the first portion.

16 Claims, 7 Drawing Sheets

FIG·6A

|  | | | |
|---|---|---|---|
| C-A | OFF | ON | ON |
| C-B | OFF | OFF | ON |

FIG·6B

|  | | | |
|---|---|---|---|
| C-A | OFF | ON | OFF |
| C-B | OFF | OFF | ON |

FIG·6C

|  | | | |
|---|---|---|---|
| C-A | ON | OFF | OFF |
| C-B | ON | ON | OFF |

FIG·6D

|  | | | |
|---|---|---|---|
| C-A | ON | OFF | ON |
| C-B | ON | ON | OFF |

METHOD OF TESTING A WIRE HARNESS USING A MULTICONTACT CONNECTOR

BACKGROUND OF THE INVENTION

1. Field of the Invention

The present invention relates to a method of testing terminals and housing of a wire harness and an apparatus therefor.

2. Description of the Related

Wire harnesses for use with automobiles include not only wires for sending signals necessary for normal driving but also wires for use with various safety circuits such as air bag. A multicontact connector uses tin-plated copper terminals to connect signals for normal driving and gold-plated copper-terminals to ensure electrical connection of safety circuits. The tin-plated terminals and gold-plated terminals are of substantially the same shape. Thus, it is difficult to check in terms of shape that the two kinds of terminal have been inserted into the right terminal cavities. Therefore, the color of plated terminals is inspected to visually identify the terminals inserted into the cavities. This type of inspection is not reliable in identifying a number of terminals. In order to solve this problem, the inventor has proposed in Japanese patent Preliminary Publication No. 6-13276 a method of reliably distinguishing between two kinds of terminals by the use of a continuity-testing device shown in FIG. 9. In this method, terminals of one kind are positioned forwardly of terminals of the other, and a continuity-testing device shown in FIG. 7 is used.

Figure 9:
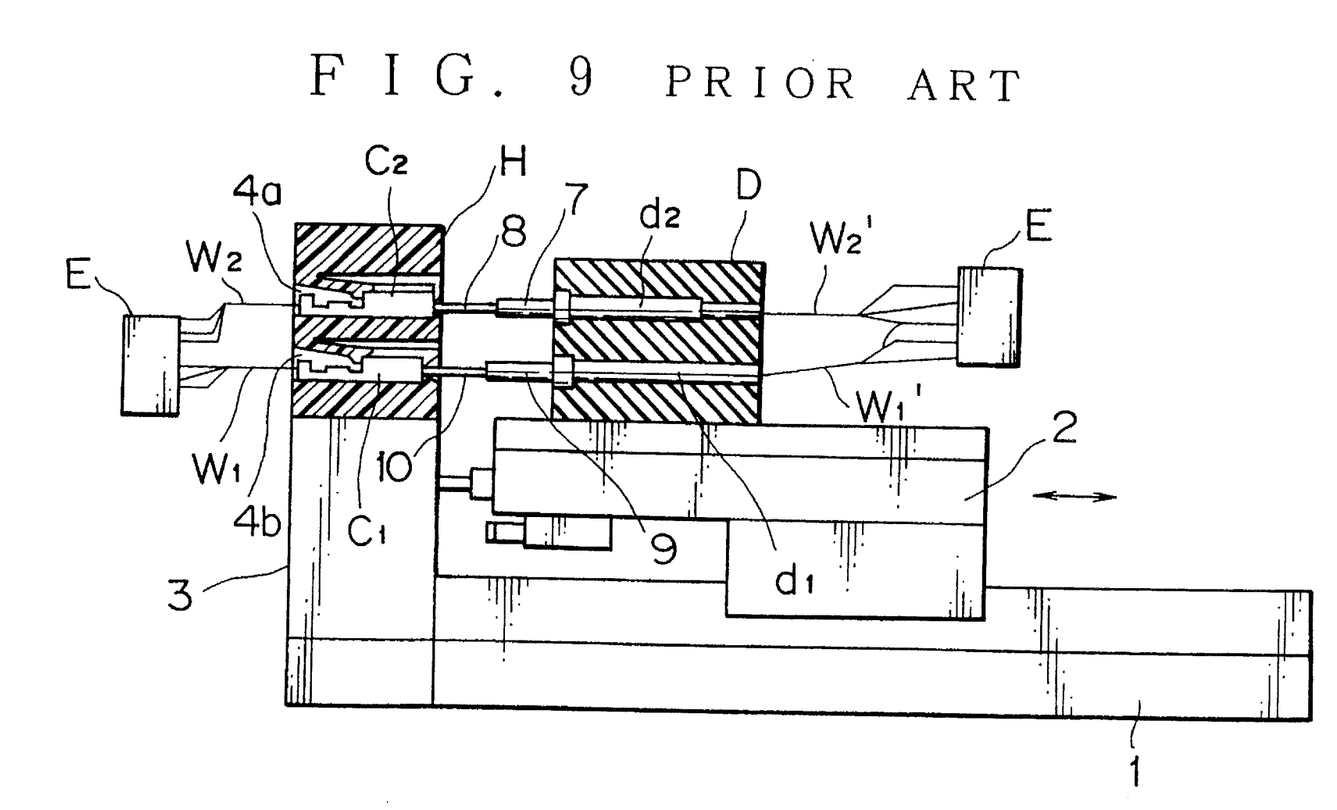
FIG. 9 illustrates a testing device disclosed in Japanese Patent Preliminary Publication No. 6-13276.

A carriage base 2 is carried on a guide rail 1 and a testing device D is fixedly mounted on the carriage base 2. A multicontact connector H under test is positioned on a connector support 3 so that the connector H opposes the testing device D. A lower terminal cavity 4 of the multicontact connector H receives a gold-plated terminal C1 and upper terminal cavity 4 receives a tin-plated terminal C2. The terminals C1 and C2 are connected to wires W1 and W2, respectively, which in turn are connected to a continuity-testing device E.

The testing device D has a switch pin d1 for identifying the terminal C1 and a switch pin d2 for identifying the terminal C2. The pins d1 and d2 oppose the terminals C1 and C2, respectively. The switch pins d1 and d2 are connected to wires W1' and W2', respectively, which are connected via the continuity-testing device E to the wires W1 and W2 to complete test circuits.

Figure 10:
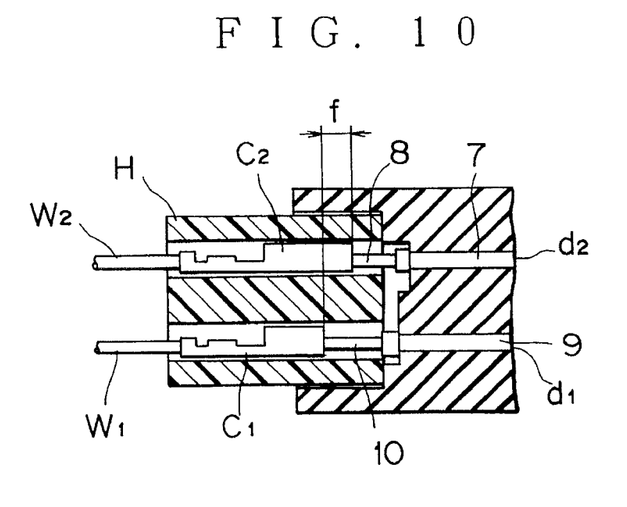
FIG. 10 illustrates the positions of two different kinds of terminals.

The terminals C1 and C2 have substantially the same shape and the terminal C2 is positioned a distance f=1.5 millimeters forwardly of the terminals C1, as shown in FIG. 10.

The switch pin d2 has a contact pin 8 which slidably extends through a cylindrical metal tube 7 and is biased by a spring in such a direction such as to project outwardly of the tube 7. The switch pin d1 has a contact pin 10 which slidably extends through a metal tube 9 and is biased by a spring in a direction such as to protect outwardly of the tube. The contact pin 10 causes to open a normally-closed switch incorporated therein when pushed inwardly of the metal tube 9.

When the carriage base 2 is moved a predetermined distance towards the connector H, the contact pin 8 of the switch pin d2 moves into contact with the terminal C2 if the terminal C2 has been inserted in the cavity 4a, but does not if the terminal C1 is erroneously present in the same cavity. The contact pin 10 of the switch pin d1 moves into contact with the terminal C1 if the terminal C1 has been inserted in the cavity 4b. The contact pin 10 is pushed inwardly of the metal tube 9 if the terminal C2 has been erroneously inserted in the cavity 4b, causing the normally-closed switch in the switch pin d1 to open so as to not provide continuity of the test circuit.

The aforementioned testing device permits simultaneous check of whether the proper terminal is in the proper cavity and of continuity of the circuits for proper insertion of the respective terminals C1 and C2. However, a different testing device must be used for a different arrangement of the terminal C1 and C2 even if the terminals are housed in a housing of the same design. This leads to an increased number of testing devices.

Figures 11A, 11B, 11C:
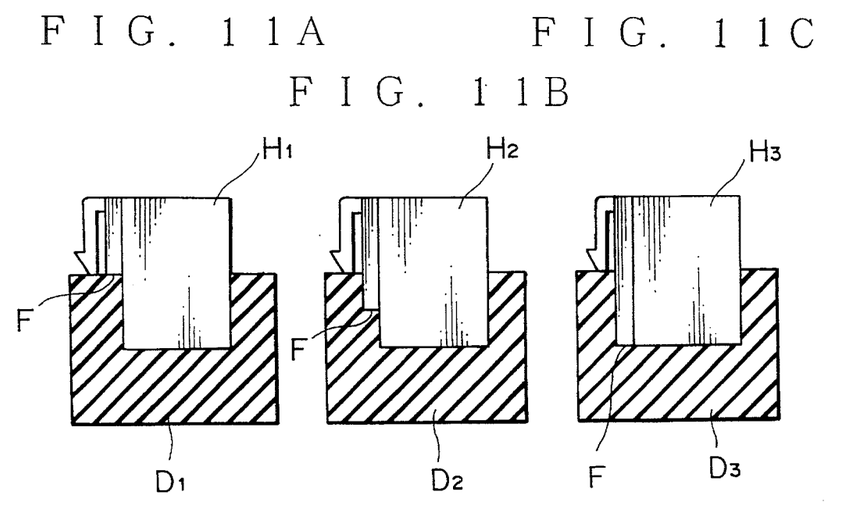
FIG. 11A–11C show housings H1, H2, and H3, each of which is formed with a cutout surface F.

In addition to the above problems, there are some problems in identifying various models of housings. FIGS. 11A–11C show housings H1, H2, and H3, each of which is formed with a cutout surface F at different locations in the outer surface thereof though the same number of terminals are arranged in the same arrangement. In order to identify housings H1, H2, and H3 from each other, the testing devices D, D2, and D3 are formed with recesses configured to the outer surfaces of the housings H1, H2, H3.

However, the testing device D1 can receive only the housing H1 while the testing device D3 can receive both housing H1 and H2. Thus, this type of testing device cannot identify different models of housing from each other. Further, a switch for detecting a terminal fully inserted into a cavity is unable to determine whether terminals are either partially inserted or have no portion inserted.

SUMMARY OF THE INVENTION

A method of identifying a position of a portion of a multicontact connector includes steps (a)–(e).

In step (a), a connector (H) is fixedly arranged to oppose at least one multicontact switch pin (11, 23, 24, 33) which has at least two contacts (A, B) and a probe pin (14, 39) projecting outwardly of the multicontact switch pin. The probe pin (14, 39) is adapted to move into and/or out of contact with the contacts when the probe pin (14, 39) is pushed inwardly into the multicontact switch pin.

In step (b), a first portion (C1, C2, F) is formed on the connector positioned differently in accordance with a kind of the connector. The first portion is, for example, the forward end of a terminal or a cutout formed on the housing of the connector in a direction in which the probe pin extends.

In step (c), each of the contacts (A, B) is connected to a corresponding test circuit.

In step (d), the multicontact switch pin (11,23,24,33) is moved by a predetermined distance towards the connector to allow the probe pin (14, 39) to engage the first connector to allow the probe pin (14, 39) to engage the first portion so that the probe pin (14, 39) moves into and/or out of contact with the contacts (A, B).

In step (e), continuity in the test circuits is checked to determine the position of the first portion in a direction in which the probe pin (14, 39) moves towards the first portion.

An apparatus for testing a wire harness component, comprising a platform on which a connector is fixedly placed. The connector has at least a portion which is differently position in accordance with a kind of the connector. The first portion is, for example, the forward end of a terminal or a cutout formed on the housing of the connector. A multicontact switch pin (11, 23, 24, 33) includes at least two contacts (A, B) and a probe pin (14, 39). The probe pin (14, 39) has a distal end projecting outwardly of the multicontact switch pin and is adapted to move into and/or out of contact with the contacts (A, B) when the probe pin is pushed inwardly of the multicontact switch pin. The probe pin extends towards the first portion of the connector. The contacts are connected to test circuits (17, 22). A continuity-testing device (E) checks continuity of the test circuits through the contacts (A, B) resulted from a movement of the probe pin (14, 39).

BRIEF DESCRIPTION OF THE DRAWINGS

Features and other objects of the invention will become more apparent from the description of the preferred embodiment with reference to the accompanying drawings in which.

DETAILED DESCRIPTION OF THE PREFERRED EMBODIMENTS

Construction

Figure 1:
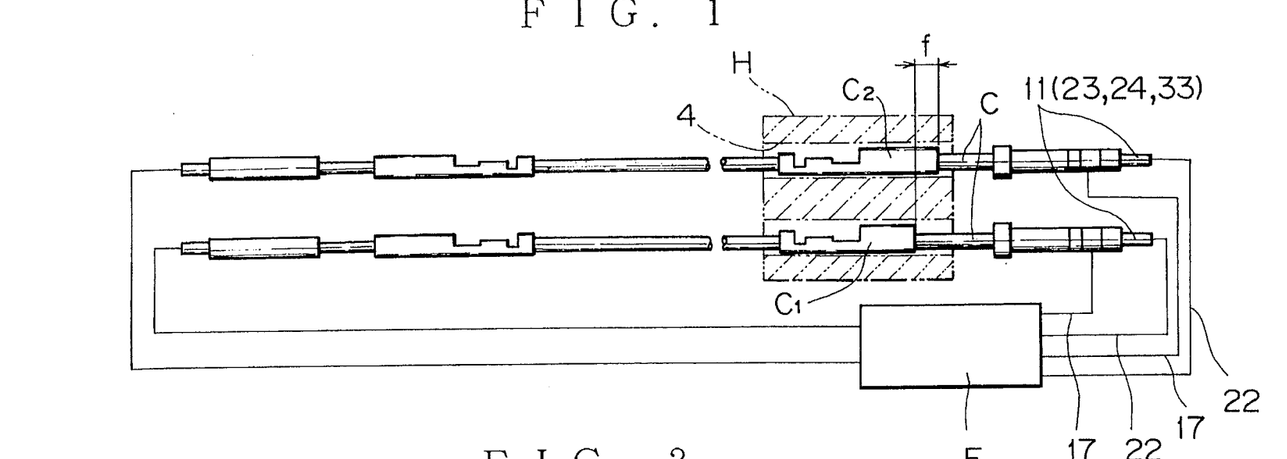
FIG. 1 is an illustrative diagram for illustrating a testing circuit of the testing apparatus.
Figure 2:
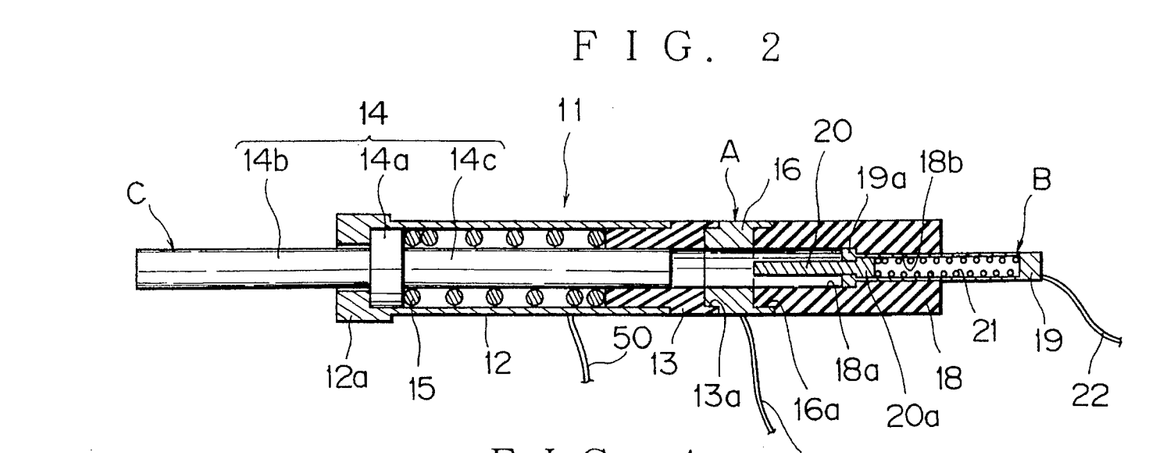
FIGS. 2 and 3 are longitudinal cross-sectional views of a normally-open two-contact switch pin.
Figure 3:
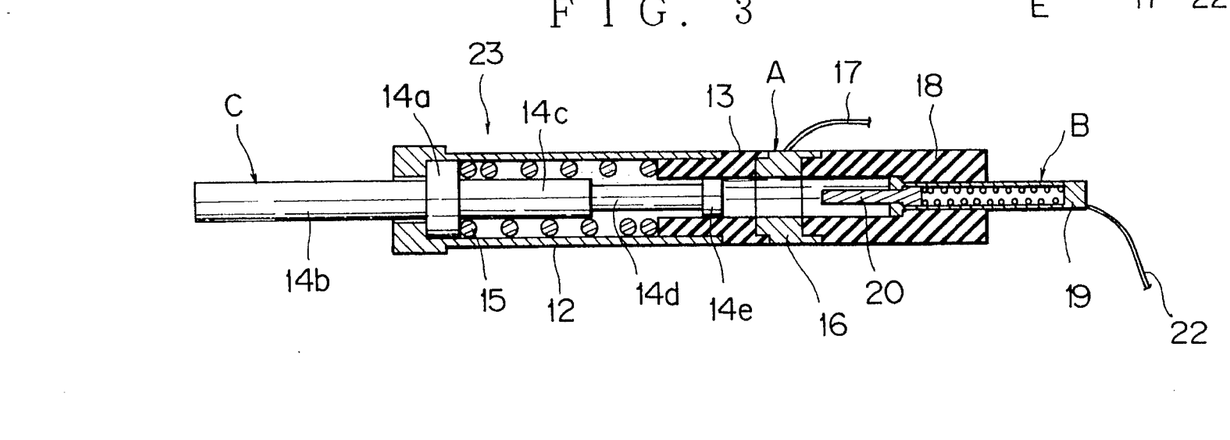
Figure 4:
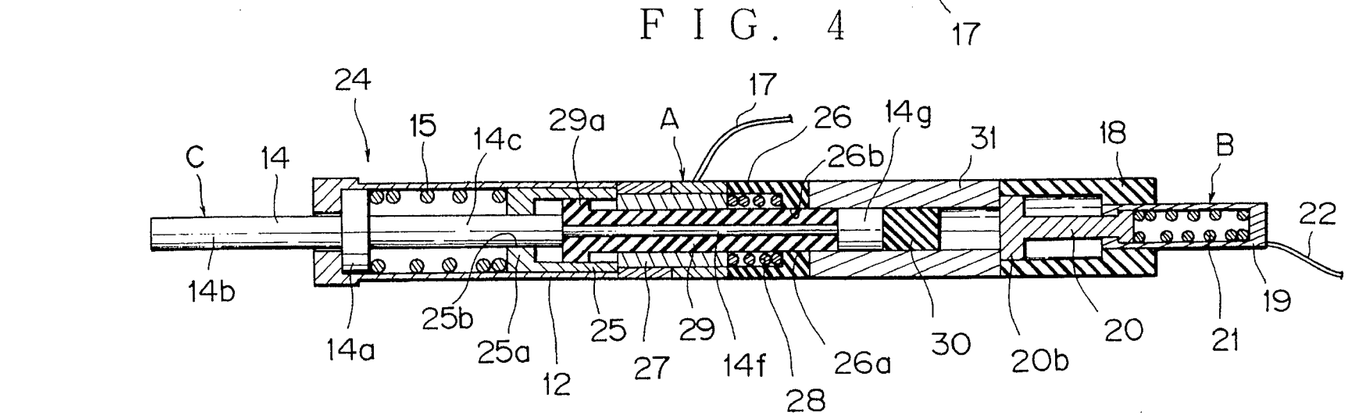
FIGS. 4 and 5 are longitudinal cross-sectional views of a normally-closed two-contact switch pin.
Figure 5:
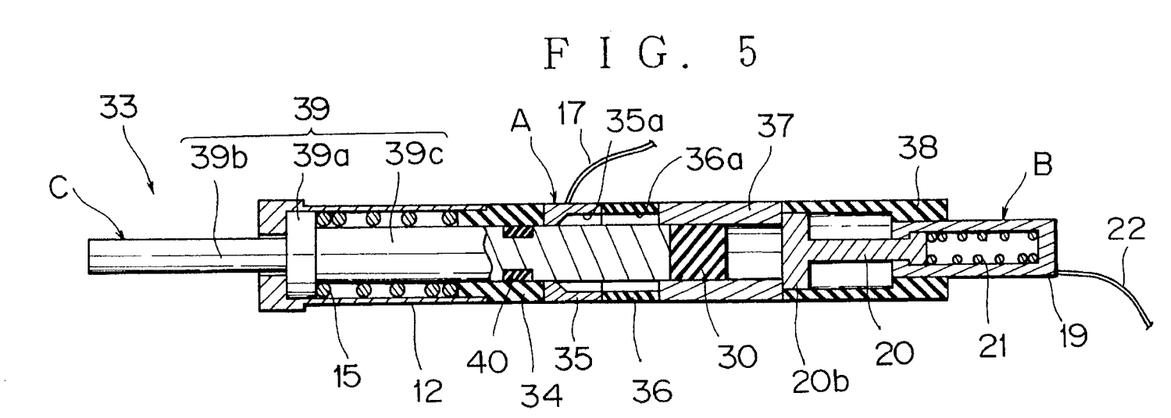

The construction of a testing apparatus according to the present invention will now be described with reference to FIGS. 1–5. FIG. 1 is an illustrative diagram for illustrating testing circuits of the testing apparatus. FIG. 2 and 3 are longitudinal cross-sectional views of a normally-open two-contact switch pin and FIGS. 4 and 5 are longitudinal cross-sectional views of a normally-closed two-contact switch pin.

Referring to FIG. 1, a multicontact connector H has a gold-plated terminal C1 and tin-plated terminal C2 each of which is inserted in the corresponding terminal cavity. The terminals C2 and C1 are positioned as in the prior art apparatus, i.e., the forward end of the terminal C2 is forward of the terminal C1 by a distance of about f =1.5 millimeters.

The terminals C1 and C2 are in line with the corresponding two-contact switch pins, respectively, when the multicontact connector H is positioned in place on a platform Q. The two-contact switch pins include a normally-open type (FIGS. 2 and 3) and a normally-closed type (FIGS. 4 and 5).

Referring to FIG. 2, a normally-open type two-contact switch pin 11 includes a body 12 having a thick portion 12a at the forward end portion thereof and a first insulating tube 13 fitted into a rear end portion of the body 12.

A probe pin 14 slidably inserted into the body 12 takes the form of a metal bar, and includes a disc 14a slidable on the inner surface of the body 12, forward half 14b that extends from the disc 14a and projects outwardly of the body 12 through the thick portion 12a, and rear half 14c that extends rearwardly of the disc 14a. A spring 15 mounted between the insulating tube 13 and the disc 14a, urges the probe pin 14 in such a direction such that the forward half 14b projects outwardly of the body 12.

The insulating tube 13 is formed with an annular projection 13a at the rear end thereof into which a switch element 16 in the form of a metal tube is fitted.

The switch element 16 serves as a normally-open contact A, which is connected to a wire 17 which in turn is connected to the continuity-testing device E. The switch element 16 is formed with an annular projection 16a at the end thereof into which a second insulating tube 18 is fitted. The second insulating tube 18 has a large-diameter bore 18a in the forward half thereof and a small-diameter bore 18b in the rear half communicating with the bore 18a. A tubular electrode 19 is firmly fitted into the bore 18b. The electrode 19 is formed with a flange 19a radially projecting both inwardly and outwardly of the tubular electrode 19. An electrode 20 extends through the flange 19a and is formed with a large-diameter portion 20a. The large-diameter portion 20a is urged within the tubular electrode 19 by a spring 21 in such a direction as the electrode 20 projects toward the probe pin 14. The electrode 19 forms a contact B of the testing apparatus, and a wire 22 connected to the electrode 19 connects to the continuity-testing device E. An additional wire 50 may be attached to the body 12 so as to enable continuity test between the contacts A, B and the probe pin 14 without establishing a test circuit through the contact C. The wire 50 is are particularly useful in identifying different housings, which are described below.

Figure 6A:
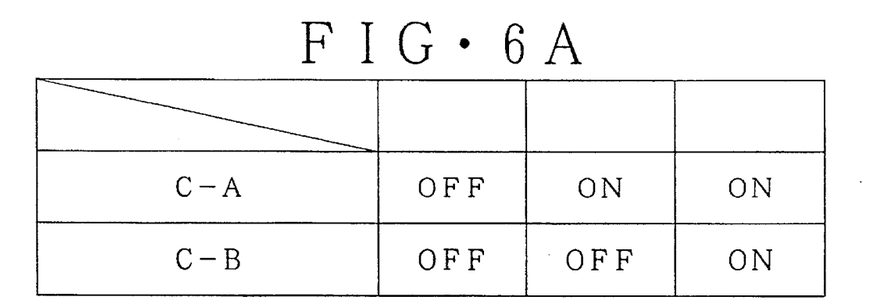
FIGS. 6A–6D illustrate how the positions of a terminal relative to the cavity is determined.

A method of identifying the kinds of terminals through the use of the apparatus in FIG. 2, will now be described with reference to FIGS. 6A. As shown in FIG. 1, a carriage, not shown, for carrying the multicontact switch pins 11 thereon is moved a predetermined distance towards the connector H. If the terminals C1 and C2 have not yet been inserted in the multicontact connector H, the probe pin 14 remains projected forwardly of the body 12 so that the normally-open type two-contact switch 11 is open between a probe pin 14 and the contact A and between the probe pin 14 and the contact B, and therefore there is no continuity between the wires 17 and 22 ("zero stroke" shown in FIG. 6A).

If the terminals C1 and C2 have been inserted in the multicontact connector H, the forward half 14b of the probe pin 14 contacts the gold-plated terminal C1 and is therefore pushed backward upon further forward insertion of the switch pin 11. The backward movement of the probe pin 14 causes the end portion of the rear half 14c to contact with the switch element 16, closing between the contacts C and A so that a current flows through the wires 17. The rear end 14c has not yet been in contact with the electrode 20 so that the contact B and contact C are not in contact with each other, and therefore no electrical continuity is established through the wire 22 ("small stroke" shown in FIG. 6A).

When the forward end 14b moves into contact with the tin-plated terminal C2, the probe pin 14 is pushed significantly backward so that the rear end 14c moves into contact with the electrode 20 to close between the contacts C and B, establishing continuity through the wires 22. The contacts C and A remain closed so that continuity is maintained through the wire 17 ("large stroke" shown in FIG. 6A). The continuity-testing device E determines the state of the testing circuit from among the states shown in FIG. 6A, thereby enabling a check of whether the terminals C1 and C2 have been inserted into the right cavities.

FIG. 3 is a longitudinal cross-sectional view of another normally-open two-contact switch pin 23. The switch pin 23 is the same as the normally open two-contact switch pin 11 except that the probe pin 14 has a non-contacting recess 14d and a contact 14e at a rear end thereof.

A method of identifying the kinds of terminals through the use of the normally-open two-contact switch pin 23 in place of the normally-open switch pin 11, will now be described with reference to FIG. 6B. As shown in FIG. 1, a carriage, not shown, carrying the multicontact switch pins 23 thereon is moved a predetermined distance towards the connector H.

Figure 6B:
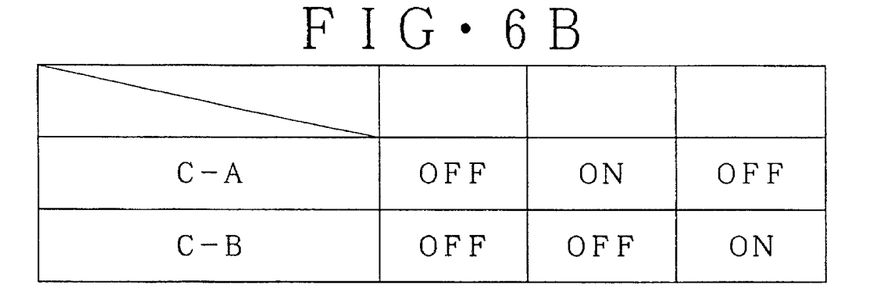

If the terminals C1 and C2 have not yet been inserted in the multicontact connector H, the circuits are open between the contacts C and A and between the contacts B and C ("zero stroke" shown in FIG. 6B). When the forward end 14b of the pin 14 moves into contact with the gold-plated terminal C1, the probe pin 14 is pushed backward so that the contact 14e moves into contact with the switch element 16 and the circuit is closed between the contact C and contact A to establish electrical continuity through the wire 17. The contact 14e of the probe pin 14 is not in contact with the electrode 20 so that the contacts B and C are open therebetween establishing no continuity through the wire 22 ("small stroke" shown in FIG. 6B).

When the forward end 14b moves into contact with the tin-plated terminal C2, the probe pin 14 is pushed significantly backward so that the contact 14e moves into contact with the electrode 20 while the non-contact portion 14d opposes the switch element 16. Thus, the circuit is closed between the contacts B and C while the circuit is opened between the contacts C and A ("large stroke" shown in FIG. 6B). The continuity-testing device E determines the state of the testing circuit from among the states shown in FIG. 6B, enabling a determination of whether the terminals C1 and C2 have been inserted into the appropriate cavities.

FIG. 4 is a longitudinal cross-sectional view of a normally-closed two-contact switch pin 24. A hollow metallic cylinder 25 is fitted into the rear end portion of a bore thereof. An insulating tube 26 is securely fixed to the rear end portion of a body 12. The insulating tube 26 is formed with a rear wall 26a and is securely connected to the normally-closed contact A at a forward end of the insulating tube 26. The contact A is connected to the wire 17. A hollow metallic cylinder 27 extends through the insulating tube 26 and a spring 28 is mounted between the rear wall 26a and the cylinder 27 so as to urge the cylinder 27 against the cylinder 25. Thus, the cylinder 27 is in pressure contact with the cylinder 25. The cylinder 25 is formed with a forward wall 25a having a small diameter hole 25b therein. A rear portion 14c of the probe pin 14 slidably extends through the hole 25b and is biased by a spring 15 in a direction such that the probe pin 14 projects outwardly of the body 12. A narrow long rod 14f extends from the rear end 14c through an insulating tube 29. The insulating tube 29 is formed with a flange 29a slidable within the bore of the cylinder 25. The outer circumferential surface of the insulating tube 29 is slidable on the surface of the bore of metal cylinder 27 and a hole 26b formed in the rear wall 26a.

The long rod 14f is formed with a contact 14g at a rear end thereof and an insulator 30 attached to a rear end of the contact 14g.

A metal cylinder 31 is mounted to the rear end of the insulator 26. The insulating tube 29, contact 14g and insulator 30 are slidable within the cylinder 31. A second insulating tube 18 is fixed to the rear end of the cylinder 31 and an tubular electrode 19 is fixedly mounted in the second insulating tube 18. An electrode 20 is biased by a spring 21 mounted within the electrode 19. The electrode 20 is formed with a flange 20b at a forward end thereof which is slidable within the second insulating tube 18. The normally-closed two-contact switching pin 24 is similar to the normally-open two-contact switch pins 11 and 23 in that the tip end of contact 14 serves as the contact C and the electrode 19 as the contact B, the electrode 19 is connected to the wire 22, and the wires 17 and 22 are connected to the continuity testing device E.

A method of identifying the kinds of terminals through the use of the normally-closed two-contact switch pin 24 in place of the normally-open two-contact switch pins 11 and 23, will now be described with reference to FIG. 6C. As shown in FIG. 1, a carriage, not shown, carrying the multicontact switch pins 24 thereon is moved a predetermined distance towards the connector H.

If the terminals C1 and C2 have not yet been inserted into the multicontact connector H, the probe pin 14 remains projected and the rear end of the cylinder 25 is in contact with the cylinder 27. Thus, the probe pin 14 is in contact with the cylinder 27 via the cylinder 25 and the cylinder 27 is in electrical contact with the contact A. Thus, the circuit is closed between the contacts C and A.

Since the contact 14g is in contact with the electrode 20 via the cylinder 31, the circuit is closed between the contacts C and B. Thus, a continuity is established through the wires 17 and 22 ("zero stroke" shown in FIG. 6C).

When the forward end 14b of the pin 14 moves into contact with the gold-plated terminal C1, the probe pin 14 is pushed backward significantly together with the insulator 29 so that the flange 29a pushes the cylinder 27 backward. The cylinder 27 leaves the cylinder 25, thereby causing the contacts C and A to be opened. The contact 14g is electrically continuous with the electrode 20 via the cylinder 31 and therefore the contacts C and B remain closed ("small stroke" shown in FIG. 6C).

When the probe pin 14 moves into contact with the tin-plated terminal C2, both the probe pin 14 and the insulator 30 are significantly pushed back so that the insulator 30 pushes the electrode 20 to separate the electrode 20 from the cylinder 31, causing the contacts C and B to be opened. The contacts C and A remain opened ("large stroke" shown in FIG. 6C).

Figure 6C:
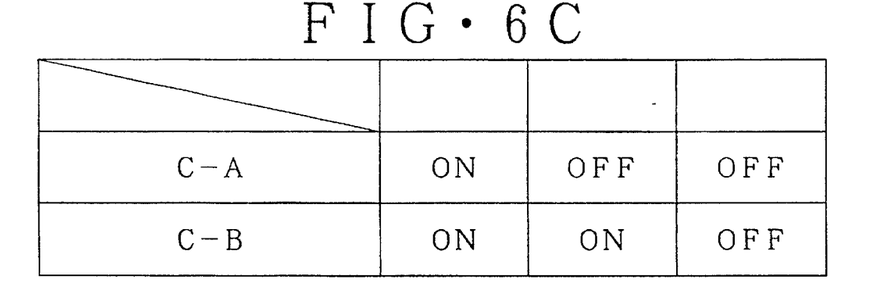

The continuity-testing device E determines the state of the testing circuit from among the states shown in FIG. 6C, thereby enabling determination of whether the terminals C1 and C2 have been inserted into the appropriate cavities.

FIG. 5 is a longitudinal cross-sectional view of another normally-closed two-contact switch pin 33. A hollow metallic body 12 fits over a first insulating tube 34 and a metallic tubular switch element 35 is connected to the rear end of the first insulating tube 34. The switch element 35 is formed with a large bore 35a at a rear end portion thereof. The switch element 35 serves as a normally-closed contact A and is connected to the wire 17 connected to the continuity-testing device E.

The switch element 35 connects at a rear end thereof to a second insulating tube 36 having a large bore 36a. The rear end of the second insulating tube 36 is connected to a metal cylinder 37 whose rear end connects a third insulating tube 38. The third insulating tube 38 fits over a tubular electrode 19 that serves as a contact B. A spring 21 urges the electrode 20 in the tubular electrode 19 in a direction such that the electrode projects forwardly (to the left in FIG. 5).

The probe pin 14 inserted into the body 12 includes a disc 39a slidable within the bore of the body 12, a forward half 39b that extends forwardly from the disc 39a and projects outwardly of the body 12, and a rear half 39c that extends rearwardly from the rear end of the disc 39a. The rear half 39c is formed with an annular groove around its outer surface into which an insulating ring 40 fits, and is securely connected at a rear end thereof to an insulator 30. The probe pin 39 is urged by a spring 15 mounted between the first insulating tube 34 and the disc 39a in a direction such that the forward end 39b projects forwardly of the body 12.

Figure 6D:
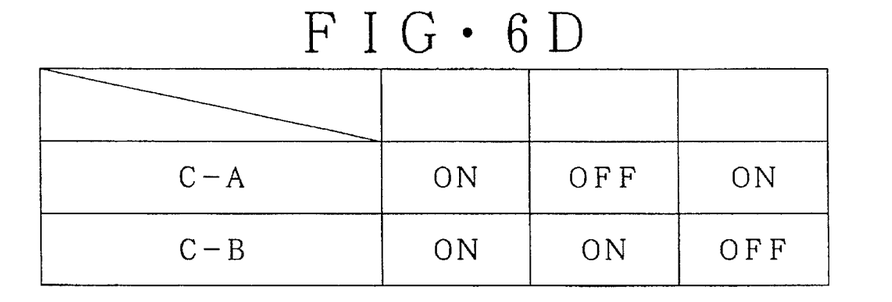

A method of identifying the kinds of terminals through the use of the normally-closed two-contact switch pin 33 will now be described with reference to FIG. 6D.

If the probe pin 39 is in a projected position prior to testing or if terminals C1 and C2 have not yet been inserted in the multicontact connector H, the outer circumferential surface of the rear half 39c is in contact with the switch element 35 to close between the contacts C and A. The outer circumferential surface of the rear half 39c is in contact with the electrode 20 via the cylinder 37 so that the contacts C and B are closed ("zero stroke" show in FIG. 6D). When the forward half 39b moves into contact with the gold-plated terminals C1, the probe pin 39 is pushed back so that the insulating ring 40 moves into contact with the switch element 35, thereby opening the contacts C and A. At this time, the probe pin 39 is still in contact with the electrode 20 via the cylinder 37 and therefore the contacts C and B remain closed ("small stroke" shown in FIG. 6D).

When the probe pin 39 abuts the tin-plated terminal C2, the probe pin 39 is significantly pushed back to move into contact with the switch element 35, closing the contacts C and A. The insulator 30 pushes the electrode 20 rearward so that the electrode 20 disengages from the cylinder 37 to open contacts C and B ("large stroke" shown in FIG. 6D). The continuity-testing device E determines the state of the testing circuit from among the states in FIG. 6A the testing circuit is, thereby enabling a determination of whether the terminals C1 and C2 have been inserted into the appropriate cavities.

The embodiments have been described with respect to a two-contact switch pin. The two-contact switch pin may be converted into a three-contact switch pin at the expense of added complexity. By using a three-contact switch pin, three kinds of terminals may be identified by properly arranging relative positions in axial direction of the terminals.

Figure 7A:
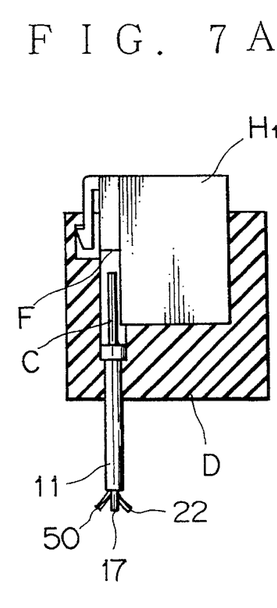
FIGS. 7A–7C illustrate how housings H1, H2, and H3 having a cutout surface F at different locations thereon are identified.
Figure 7B:
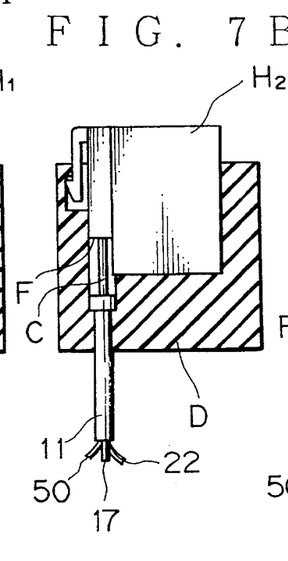
Figure 7C:
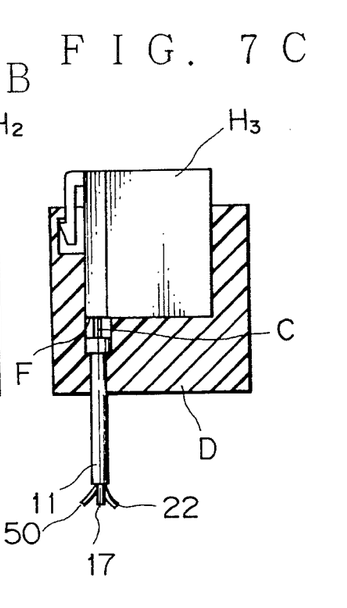

A method of identifying housings H1, H2, and H3, which are formed with a cutout surface F at different locations in the outer surface thereof, will be described as follows:

As shown in FIGS. 7A–7C, a multicontact switch pin 11 is attached to each testing device D so that the multicontact switch pin 11 aims at the surface F when a housing is fitted to the testing device D. This multicontact switch Din 11 has the wire 50 attached to the body 12 so that three wires 17, 22 and 50 are directed to the continuity testing device E.

As shown in FIG. 7A, when the housing H1 is fully inserted into the testing device D, the contact C of the two-contact switch pin 11 does not contact the cutout surface F of the housing H1. This corresponds to "zero stroke" shown in FIG. 6A. Likewise, FIG. 7B corresponds to "small stroke" shown in FIG. 6A, and FIG. 7C corresponds to "large stroke" shown in FIG. 6A. In this manner, housings of different models may be identified.

A method of identifying positions of a terminal G within the cavity will now be described.

Figure 8A:
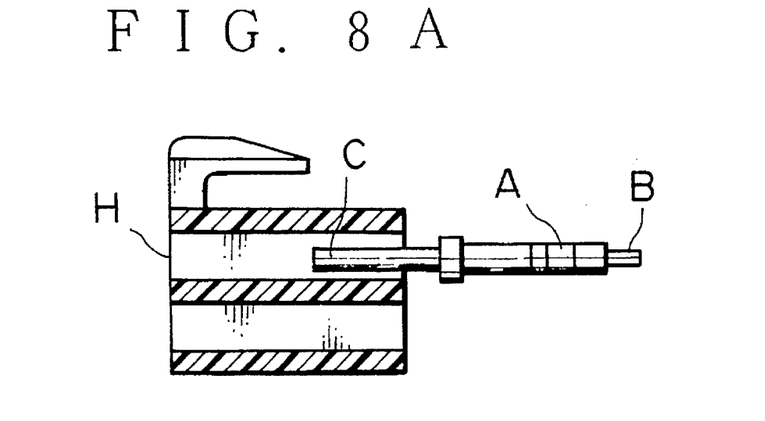
FIGS. 8A–8C illustrate how the position of a terminal G relative to the cavity is determined.
Figure 8B:
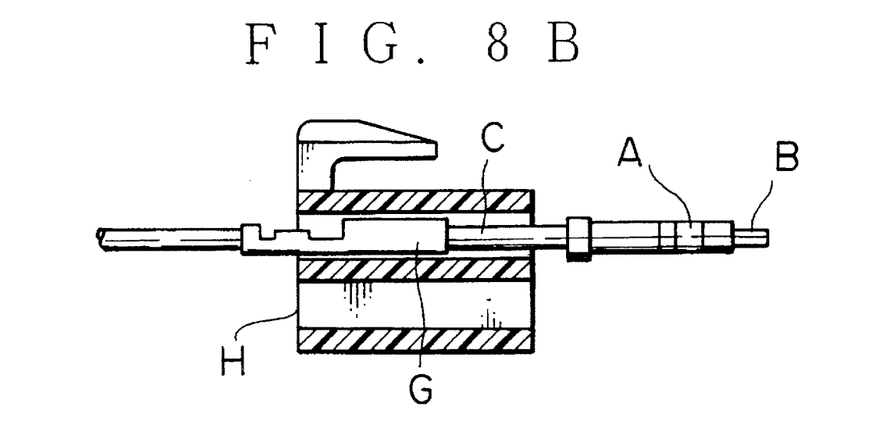
Figure 8C:
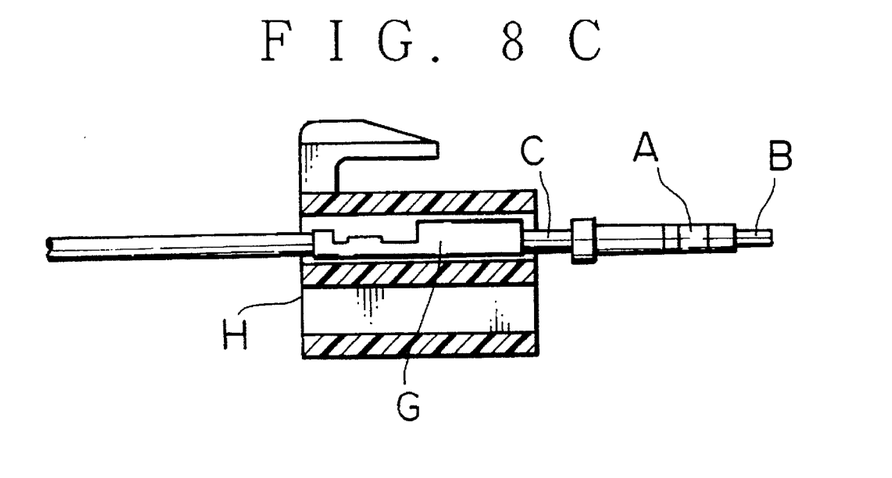

The testing device E is provided with a two contact type multicontact switch pin that is arranged in line with the terminals G when the connector H is positioned in place. If a terminal has not yet been inserted in the cavity, then the contact C of two-contact switch 11 is not pushed back at all as shown in FIG. 8A, which corresponds to "zero stroke" shown in FIG. 6A. Likewise, if the terminal has not been fully inserted into the cavity, then the contact C of two-contact switch 11 is pushed back a short distance as shown in FIG. 8B, which corresponds to "small zero stroke" shown in FIG. 6A. If a terminal has not been fully inserted in the cavity, then the contact C of two-contact switch 11 is pushed back fully as shown in FIG. 8C, which corresponds to "large stroke" shown in FIG. 6A. The continuity-testing device E determines the state of the testing circuit from among the states in FIG. 6A, thereby enabling a determination of whether the terminal G has been fully inserted into the appropriate cavities.

What is claimed is:

1. A method of identifying a position of a portion of a multicontact connector, including steps of:

(a) fixedly arranging a connector to oppose at least one multicontact switch pin which has at least two contacts and a probe pin projecting outwardly of the multicontact switch pin, said probe pin being adapted to move into and/or out of contact with said contacts when pushed inwardly into the multicontact switch pin;

(b) placing a first portion on said connector at a position which varies in accordance with a kind of said connector, said first portion being in a direction in which the probe pin extends;

(c) connecting each of said contacts to a corresponding test circuit;

(d) moving said multicontact switch pin by a predetermined distance towards the connector to allow said probe pin to engage said first portion such that said probe pin moves into and/or out of contact with said contacts; and (e) checking continuity in the test circuits to determine a position of said first portion in a direction in which said probe pin moves towards said first portion.

2. The method according to claim 1, wherein said first portion is a front end of a terminal fully inserted into a cavity of the connector and said front end being positioned in a direction in which said probe pin moves towards said first portion, said position varying according to a kind of said terminal.

3. The method according to claim 1, wherein said first portion is a cutout formed in a housing of the connector, and said cutout being arranged in various positions in a direction in which said probe pin moves towards said first portion.

4. The method according to claim 1, wherein said first portion is a front end of a terminal not fully inserted into a housing of the connector, and said multicontact switch pin is moved by a predetermined distance towards the connector to cause said probe pin to engage said front end so that said probe pin moves into and/or out of contact with said contacts in accordance with the position of the front end of the terminal.

5. An apparatus for testing wire harness components, comprising:

a platform on which a connector is fixedly placed, said connector having at least a portion arranged in a position which differs according to a kind of said connector;

at least one multicontact switch pin including at least two contacts and a probe pin, said probe pin having a distal end projecting outwardly of the multicontact switch pin and being adapted to move into contact and/or out of contact with the contacts when said probe pin is pushed inwardly of the multicontact switch pin, said probe pin extending towards the first portion of the connector;

test circuits to which the contacts are connected; and a continuity-testing device for checking continuity of the test circuits through said contacts resulting from a movement of said probe pin.

6. The apparatus according to claim 5, wherein said first portion is a front end of a terminal fully inserted into the connector, said front end being arranged in a position which differs according to a kind thereof in a direction in which said probe pin extends towards the first portion, and said continuity-testing device checking continuity of the test circuits through said contacts to determine a kind of the terminal.

7. The apparatus according to claim 5, wherein said first portion is a cutout formed in a housing of the connector, and said cutout being arranged in one of several positions in a direction in which said probe pin moves towards said first portion, and said continuity-testing device checking continuity of the test circuits through said contacts to determine a kind of the housing.

8. The apparatus according to claim 5, wherein said first portion is a front end of a terminal not fully inserted into a housing of the connector, and said probe pin moves into contact and/or out of contact with said contacts in accordance with the position of the front end in a direction in which said probe pin moves towards the front end of the terminal, and said continuity-testing device checks continuity of the test circuits to determine an insertion condition of the terminal.

9. The apparatus according to claim 5, wherein said probe pin is biased at a first position in a first direction in which said probe pin moves toward the connector, said probe pin being movable in a second direction opposite to the first direction, said probe pin contacting a first contact when said probe pin moves in the second direction to a second position, said probe pin contacting both a second contact and the first contact when said probe pin moves in the second direction to a third position.

10. The apparatus according to claim 9, wherein said probe pin is formed of a metallic bar (electrically conductive), and the second contact has an electrode biased in the first direction and movable in the second direction, said electrode being engaged in press contact with said probe pin when said probe pin moves to the third position.

11. The apparatus according to claim 5, wherein said probe pin is biased at a first position in a first direction in which said probe pin moves toward the connector, said probe pin being movable in a second direction opposite to the first direction, said probe pin contacting a first contact when said probe pin moves in the second direction to a second position, said probe pin moving out of contact with the first contact when said probe pin moves in the second direction to a third position, and said probe pin contacting the second contact when said probe pin moves in the second direction to a fourth position.

12. The apparatus according to claim 11, wherein said probe pin is formed of a metal bar and has a contact movable in the second direction and of a predetermined length extending in the second direction, said second contact has an electrode being pushed by said contact into press contact with said contact when said probe pin moves to the fourth position, said first contact being positioned apart from said second contact a predetermined distance greater than said predetermined length of said contact.

13. The apparatus according to claim 5, wherein said probe pin is biased at a first position in a first direction in which said probe pin moves towards the connector, said probe pin being movable in a second direction opposite to the first direction, said probe pin contacting both a first contact and a second contact when said probe pin is at a first position, said probe pin moves out of contact with the first contact while remaining in contact with the second contact when said probe pin moves to a second position, said probe pin moving out of contact with the second contact when said probe pin moves in the second direction to a third position.

14. The apparatus according to claim 13, wherein said multicontact switch pin includes:

a contact arranged between said first contact and said second contact and being in contact with said probe pin when said probe pin is between the first position and the second position; and an electrode biased in the first direction, said electrode being in pressure contact with probe pin when said probe pin is at the first position, said electrode being movable in the second direction and is in slidable contact with the first contact;

wherein said probe pin is formed of a metal bar and having a contact remote from the distal end thereof, an insulator attached to a tip end of said contact, an intermediate portion covered with an insulator, said electrode is pushed inwardly of the multicontact switch pin to move out of contact with the probe pin when the probe pin moves from the first position to the second position, whereby the probe pin moving out of contact with the first contact; and said second contact having an electrode biased in the first direction into contact with the contact and being movable in the second direction, said electrode being pushed by the probe pin to move out of contact with the contact when the probe pin moves to a third position.

15. The apparatus according to claim 5, wherein said probe pin is biased at a first position in a first direction, said probe pin being movable in a second direction opposite to the first direction, the probe pin is in contact with both a first contact and a second contact when the probe pin is at the first position, said probe pin moving out of contact with the first contact while remaining in contact with the second contact when the probe pin moves in the second direction to a second position, said probe pin again moving into contact with the first contact while moving out of contact with the second contact when the probe pin moves in the second direction to a third position.

16. The apparatus according to claim 15, wherein said multicontact switch pin includes:

a contact arranged between said first contact and said second contact, and being in contact with said probe pin when said probe pin is between the first position and the second position; wherein said probe pin is formed of a metal bar and has an insulator attached to a remote end from said distal end and a recess at an intermediate portion thereof;

said first contact is in slidable contact with the probe pin when said probe pin is between the first position and the second position, said first contact being above the recess to be out of contact with the probe pin when the probe pin is at the second position, said first contact being again in contact with said probe pin when said probe pin is between the second position and the third position; and said second contact has an electrode biased in the first direction into contact with the contact, said electrode being movable in the second direction, said electrode being pushed by the insulator to move out of contact with the contact when the probe pin moves to a third position.

* * * * *